(12) United States Patent
Chen et al.

(10) Patent No.: US 9,379,710 B2
(45) Date of Patent: Jun. 28, 2016

(54) LEVEL CONVERSION CIRCUIT AND METHOD

(71) Applicant: ARM Limited, Cambridge (GB)

(72) Inventors: Andy Wangkun Chen, Austin, TX (US); Yew Keong Chong, Austin, TX (US)

(73) Assignee: ARM Limited, Cambridge (GB)

( * ) Notice: Subject to any disclaimer, the term of this patent is extended or adjusted under 35 U.S.C. 154(b) by 164 days.

(21) Appl. No.: 14/192,056

(22) Filed: Feb. 27, 2014

(65) Prior Publication Data
US 2015/0244371 A1 Aug. 27, 2015

(51) Int. Cl.
*H03K 5/00* (2006.01)
*H03K 19/0185* (2006.01)
*H03K 19/00* (2006.01)

(52) U.S. Cl.
CPC .... *H03K 19/018507* (2013.01); *H03K 19/0013* (2013.01)

(58) Field of Classification Search
None
See application file for complete search history.

(56) References Cited

U.S. PATENT DOCUMENTS

| | | | |
|---|---|---|---|
| 2007/0002636 A1* | 1/2007 | Campbell | G11C 5/143 365/189.04 |
| 2011/0141794 A1* | 6/2011 | Kurosawa | G11C 29/025 365/148 |
| 2011/0149661 A1* | 6/2011 | Rajwani | G11C 7/12 365/189.11 |
| 2013/0106825 A1* | 5/2013 | Lapidus | G09G 3/36 345/212 |
| 2015/0091629 A1* | 4/2015 | Ishizu | G11C 5/145 327/306 |
| 2015/0179258 A1* | 6/2015 | Castro | G11C 7/10 365/163 |

OTHER PUBLICATIONS

Lin, Y-S et al., "Single Stage Static Level Shifter Design for Subthreshold to I/O Voltage Conversion", ISLPED'08, (Aug. 11-13, 2008), pp. 197-200.

* cited by examiner

*Primary Examiner* — Lincoln Donovan
*Assistant Examiner* — Khareem E Almo
(74) *Attorney, Agent, or Firm* — Pramudji Law Group PLLC; Ari Pramudji

(57) ABSTRACT

A level conversion circuit is provided for generating an output signal having one of a higher output level and a lower output level in response to an input signal having one of a higher input level and a lower input level. The level conversion circuit has input circuitry which, in response to a transition of the input signal between the higher and lower input levels, output a rising transition of a temporary output signal on the output line towards the higher input level. Output control circuitry detects the rising transition of the temporary output signal and pulls the output signal to the higher output level. This arrangement allows for fast level conversion without a DC leakage path.

18 Claims, 7 Drawing Sheets

LEVEL CONVERSION CIRCUIT AND METHOD

TECHNICAL FIELD

The present technique relates to the field of integrated circuits. More particularly, the technique relates to a level conversion circuit and method.

BACKGROUND

Level conversion circuits (also known as level shifters) are useful in integrated circuits for converting between signals in different voltage domains having different upper/lower voltage levels. In some cases it is required to provide a level conversion circuit which can switch both from a domain having a smaller upper voltage to a domain having a larger upper voltage, and from a domain having a larger upper voltage to a domain having a smaller upper voltage. Existing integrated circuit level conversion circuits of this type have a problem in that they either the incur increased power consumption because they have a direct leakage path between higher and lower power rails, or they have additional circuitry for addressing this leakage problem, but at the cost of an additional delay. The delay means that the output signal of the level conversion circuit responds slowly to changes in the input signal, which is a problem for high performance circuits.

The present technique seeks to address these problems and provide a level conversion circuit which can provide level conversion both from low-to-high and from high-to-low, and which provides improved performance and power efficiency compared to previous circuits.

SUMMARY OF THE PRESENT TECHNIQUE

Viewed from one aspect, the present technique provides a level conversion circuit for generating an output signal on an output line in response to an input signal, the input signal having one of a higher input level and a lower input level, and the output signal having one of a higher output level and a lower output level; the level conversion circuit comprising:

input circuitry coupled to a first supply node for supplying the higher input level and having an input for receiving the input signal and an output coupled to the output line, wherein the input circuitry is configured to output a temporary output signal on the output line having one of the higher input level and the lower input level, and the input circuitry is configured to output a rising transition of the temporary output signal towards the higher input level in response to a first transition of the input signal between the higher input level and the lower input level; and output control circuitry coupled to the output line and a second supply node for supplying the higher output level, and configured to detect the rising transition of the temporary output signal on the output line and, in response to detecting the rising transition of the temporary output signal, to pull the output signal on the output line to the higher output level.

The level conversion circuit converts an input signal having one of a higher input level and a lower input level into an output signal having one of a higher output level and a lower output level. The higher output level can be either larger or smaller than the higher input level. The level conversion circuit has input circuitry which is coupled to a first supply node for supplying the higher input level and which has an input for receiving the input signal and an output coupled to the output line for carrying the output signal. In response to a first transition of the input signal (either from higher input level to lower input level or from lower input level to higher input level), the input circuitry outputs a rising transition of the temporary output signal on the output line towards the higher input level. Output control circuitry is also coupled to the output line and coupled to a second supply node for supplying the higher output level. The output control circuitry detects the rising transition of the temporary output signal provided by the input circuitry, and pulls the output signal to the output line to the higher output level.

The inventors of the present technique recognised that the leakage problem in the prior art tends to occur if a circuit element is driven with a signal whose higher voltage level is smaller than the supply voltage supplied to that circuit element. Since the input circuitry in the level conversion circuit of the present technique is coupled to a supply node for supplying the higher input level rather than the higher output level, when the input signal is high it will be at the same level as the supply voltage for the input circuitry, and so no leakage path arises. However, this means that the input circuitry will output a temporary output signal at the higher input level, not the output signal at the higher output level as desired for the level conversion circuit. This is not a problem since the output control circuitry can then pull the output signal up to the higher output level. The output control circuitry can be off the critical path of the output line so that it is does not delay the output signal significantly. The input circuitry may be coupled directly to the output line and so can start to pull the signal on the output line towards the higher input level, and when this is detected by output control circuitry, the output control circuitry may pull the output signal to the higher output level.

The input circuitry may be any circuitry which outputs a rising transition of the temporary output signal on the output line in response to a first transition of the input signal (which may be either a rising or falling transition between the higher/lower input levels).

For example, the input circuitry may comprise a buffer which outputs a rising transition of the temporary output signal in response to a rising transition of the input signal from the lower input level to the higher input level.

Alternatively, the input circuitry may comprise inverting circuitry so that the first transition of the input signal is a falling transition from higher input level to lower input level, which triggers a rising transition of the temporary output signal. An inverter can be simple to implement and relatively power and area efficient. Also, the inverter may provide relatively little delay compared to other types of circuit.

In response to the first transition of the input signal, the input circuitry outputs a rising transition of the temporary output signal. On the other hand, for a second transition of the input signal in the opposite direction to the first transition, the input circuitry may output a falling transition of the temporary output signal towards the lower input level.

Often, the lower input level may be the same as the lower output level. In this case, then the falling transition of the temporary output signal provided by the input circuitry may pull the output signal towards the lower output level. If a different lower output level to the lower input level is desired, then further output control circuitry may be provided to detect the falling transition of the temporary output signal provided by the input circuitry and then to pull the output line to the lower output level in response to detecting the falling transition.

In one example, the input circuitry and output control circuitry may be arranged so that they are not in series on the output line. The input circuitry on the output control circuitry may be connected independently to the output line so that the output of the input circuitry can directly affect the level of the output line without passing through the output control circuitry.

In the case where the lower input level and the lower output level are the same, then the output control circuitry may comprise a pullup portion for pulling the output line to the higher output level, but may not have a pulldown portion for pulling the output line to the lower output level.

The level conversion circuit may be arranged so the output line is at the same level as the output of the input circuitry. Hence, when the input circuitry outputs a transition then this directly affects the output line, and when the output control circuitry pulls the output line to the higher output level then this affects the level at the output of the input circuitry.

The output circuitry may pull the output signal to the higher output level after the input circuitry has already started the rising transition of the temporary output signal.

There may be a single stage delay between the input signal and the output signal corresponding to the delay through the input circuitry. The output control circuitry need not greatly affect the delay of the output signal relative to the input signal.

In one example, isolating circuitry may be provided to isolate the input circuitry from the first supply node in response to the rising transition of the temporary output signal on the signal line. This can be useful for speeding up the switching of the output signal. By isolating the input circuitry from the first supply node once the rising transition of the temporary output signal has been detected, the output control circuitry can pull the output line to the higher output level faster because the input circuitry no longer tries to pull the output signal to the higher input level. Hence, by removing the competition of the input circuitry, the transition to the higher output level is accelerated. Other examples may omit the isolating circuitry and instead set the relative sizing of transistors in the input circuitry and the output control circuitry so that the output control circuitry can overcome the pull of the input circuitry even if the input circuitry remains active.

In some cases the level conversion circuit may be arranged so that, in response to the rising transition of the temporary output signal on the output line, the output control circuitry starts pulling the output signal towards the higher output level before the isolated circuitry isolates the input circuitry from the first supply node. This ensures that the output control circuitry is already active before the input circuitry is isolated from the first supply node so that the switch to the higher output level will continue successfully.

The output control circuitry may have at least one output control transistor which is coupled between the output line and the second supply node. The output control transistor may operate in a conductive state in response to a rising transition of the temporary output signal on the output line, and operate in a less conductive state following a transition of the output signal on the output line towards the low output level or low input level. A simple way of arranging the output control circuitry may be to provide the output control transistor as a p-type transistor and to also provide output inverting circuitry which inverts the signal on the output line and provides the inverted signal to the gate of the p-type output control transistor. This arrangement provides the functionality of the output control circuitry with relatively little circuit area and few components. The inverting circuitry which inverts the signal on the output line can for example be an inverter, or a NAND gate which receives an additional control signal which, when the control signal has a value of 1, will cause the NAND gate to function as an inverter, but when 0 clamps the output of the NAND gate to 1 to disable the p-type control transistor so that the pullup of the output line does not occur. The NAND gate can be useful, for example, to implement a power saving mode in which the output control circuitry is disabled to save dynamic switching power.

In addition to the output control transistor, the output control circuitry may also have a cut-off transistor in series with the output control transistor between the output line and the second supply node. The cut-off transistor may receive the input signal and may operate in a conductive state in response to the first transition of the input signal (the transition which triggers the rising transition of the temporary output signal) and operate in a less conductive state in response to the opposite transition of the input signal. The cut-off transistor is useful to speed up performance when the output signal is switched low. The input circuitry may have a pulldown portion which pulls the output signal to the low input level. The cut-off transistor simplifies the circuit design of the level conversion circuit, because it removes constraints on the sizing of the output control transistor relative to one or more transistors in the pulldown portion of the input circuitry. If the cut-off transistor was not provided, then the pulldown portion of the input circuitry would have to be sized so that it can overcome the competing pull of the output control transistor when switching the output signal to the lower input level. The cut-off transistor removes this constraint by breaking the conduction path between the second supply node and the output line when the output signal is to be switched to the lower output level, so that the pulldown portion of the input circuitry does not face competition from the output control circuitry, regardless of the relative sizing of the transistors.

In some cases the input circuitry may respond to more than one type of input signal. For example there might be a number of different types of control signal which all need to be level shifted and the same level shifter can be shared between these different signals to provide a common output signal generated based on a selected one of the input signals. For example, for first and second input signals the input circuitry may prioritise one over the other so that when there is the first transition of a first input signal then the rising transition of the temporary output signal is output on the output line. Following a second transition of the first input signal in the opposite direction to the first transition, then the input circuitry may output the rising transition of the temporary output signal on the output line if there is a predetermined transition of the second input signal between higher and lower input levels. Hence, the second input signal would only affect the state of the output signal if the first input signal has undergone the second transition (is at a predetermined one of the higher/lower input levels). The output control circuitry may function in the same way regardless of how many input signals are received by the input circuitry, except that where a cut off transistor is provided then multiple cut off transistors may be provided, each corresponding to one of the input signals.

The level conversion circuit may support the higher output level being higher than the higher input level and also support the higher output level being lower than the higher input level. This is different to many types of level conversion circuit which are only designed for one of these conversions. When providing a circuit supporting both types of conversion, there are more issues to consider such as the leakage/delay problems described above, which do not arise for level conversion circuits which only support conversions in one direction.

Viewed from another aspect, the present technique may provide an integrated circuit comprising a level conversion circuit as described above. The integrated circuit can be any circuit having different power domains in which a conversion between a signal in a higher domain and a signal in a lower domain (in either direction) is required.

The level conversion circuit may be particularly useful for a memory integrated circuit which has memory cells for storing data. For example, the memory may have different power saving modes of operation in which the memory can be operated at lower or higher voltage levels. Control signals for the memory, such as word lines or dummy word lines, may be based on input signals from a different voltage domain, and so a level conversion circuit can be useful for converting the input control signals into control signals at a level suitable for the power saving mode being used by the memory. To allow a flexible choice of power saving modes for the memory which can span a range of different voltage levels, the level conversion circuit of the present technique may be very useful since it can convert to both higher and lower voltage domains with reduced power consumption and improved performance, which is important for high performance memory devices.

In one example, the memory integrated circuit may have a dummy word line and control circuitry for controlling timing of operations within the memory integrated circuit (such as deactivation of sense amplifiers for sensing bit lines of the memory) based on a dummy word line signal propagated on the dummy word line in response to a timing control signal. The level conversion circuit can be useful for converting the timing control signal into the dummy word line signal, so that a single timing control signal at a given higher input level can be converted into dummy word line signals of different voltage levels depending on the higher voltage level used by the memory in the active power mode.

The memory integrated circuit may have word lines corresponding to different rows of memory cells, and each word line may have a word line driver for asserting a word line signal on the word line to select a memory cell on that row. A power gating circuit may selectively couple the word line driver to a power supply node in response to a gating control signal, so that power can be saved by isolating the word line driver from the power supply node. As the power supply node to the word line drive could be at a different level from the gating control signal, the level circuit of the present technique can be used to convert from the gating control signal to an output signal having the required voltage level, for supplying to the power gating circuit.

Viewed from another aspect, the present technique may provide a computer-readable storage medium storing a memory compiler computer program for controlling a computer to generate an instance of a memory device from a memory architecture associated with the memory compiler computer program, the memory architecture specifying a definition of circuit elements and data defining rules for combining those circuit elements, such that the instance generated specifies a memory device comprising a level conversion circuit described above. The storage medium may be a non-transitory medium.

A memory compiler can be used to generate memory instances based on a specified memory architecture which defines circuit elements to include in the memory and rules for combining those circuit elements, and a requirement specification provided by the user defining properties of the memory instance to be generated, such as the size of the memory array. The memory compiler may be arranged to include in a memory instance the level conversion circuit as discussed above.

The present technique may also be used in a standard cell library which provides standard cells for inclusion in an integrated circuit layout by an automated design tool. The standard cell library may include a cell corresponding to the level conversion circuit described above. The cell library may be stored on a non-transitory storage medium.

Viewed from another aspect, the present technique provides a level conversion circuit for generating an output signal on an output line in response to an input signal, the input signal having one of a higher input level and a lower input level, and the output signal having one of a higher output level and a lower output level; the level conversion circuit comprising:

input means for receiving the input signal, the input means being coupled to a first supply node for supplying the higher input level and having an output coupled to the output line, wherein the input means is configured to output a temporary output signal on the output line having one of the higher input level and the lower input level, and the input means is configured to output a rising transition of the temporary output signal towards the higher input level in response to a first transition of the input signal between the higher input level and the lower input level; and output control means for detecting the rising transition of the temporary output signal on the output line and, in response to detecting the rising transition of the temporary output signal, pulling the output signal on the output line to the higher output level, the output control means being coupled to the output line and a second supply node for supplying the higher output level.

Viewed from a further aspect, the present technique provides a level conversion method for generating an output signal on an output line in response to an input signal, the input signal having one of a higher input level and a lower input level, and the output signal having one of a higher output level and a lower output level; the level conversion circuit comprising:

receiving the input signal;

in response to a first transition of the input signal between the higher input level and the lower input level, outputting on the output line a rising transition of a temporary output signal towards the higher input level;

detecting the rising transition of the temporary output signal; and in response to detecting the rising transition of the temporary output signal on the output line, pulling the output signal on the output line to the higher output level.

Further aspects, features and advantages of the present technique will be apparent from the following detailed description which is to be read in conjunction with the accompanying drawings.

DESCRIPTION OF EXAMPLE EMBODIMENTS

Figure 1:
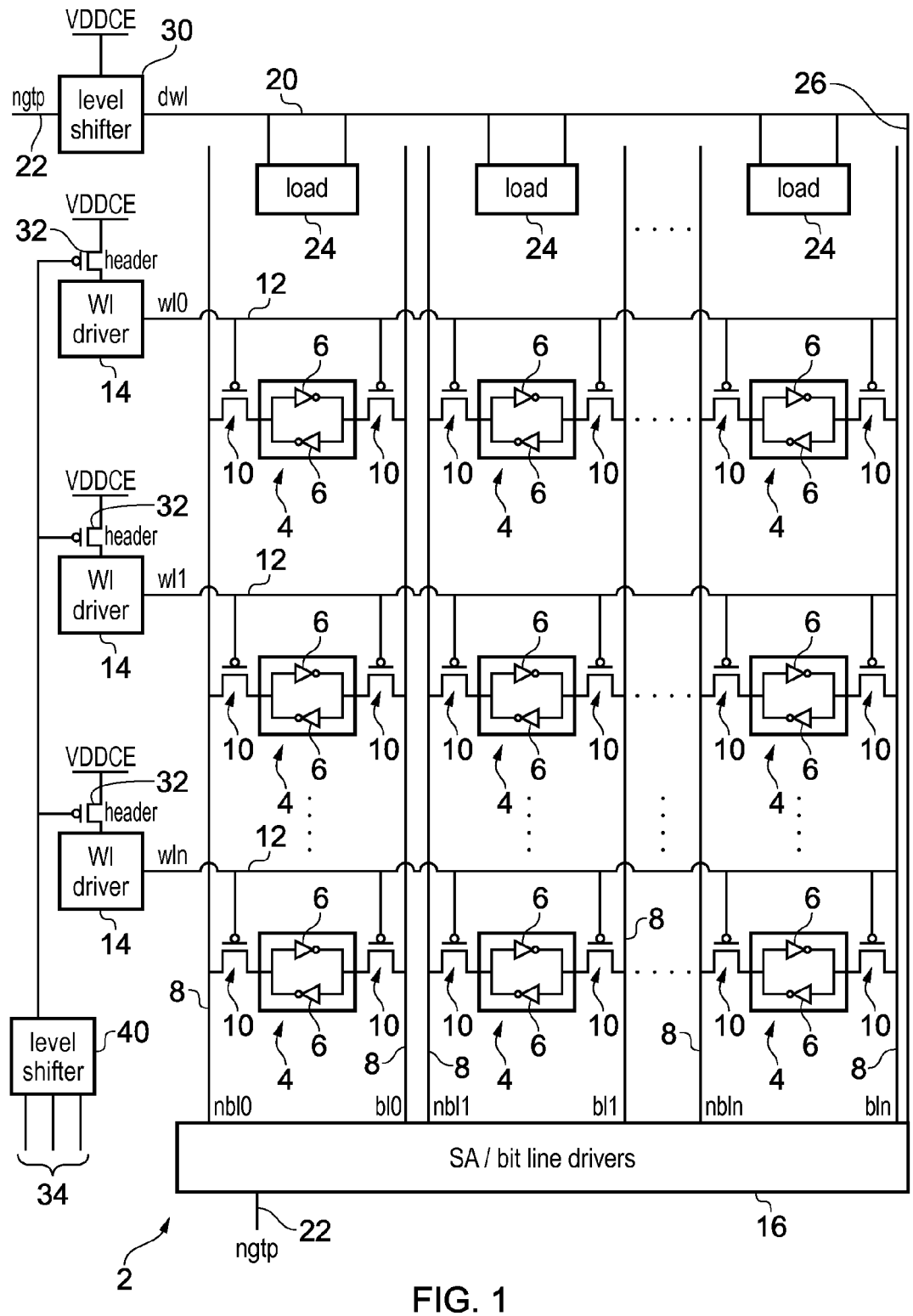
FIG. 1 schematically illustrates a memory integrated circuit comprising at least one level conversion circuit.

FIG. 1 schematically illustrates a memory integrated circuit 2 having an array of memory cells 4 which are arranged in rows and columns. FIG. 1 illustrates three cells 4 per row and three cells 4 per column, but it will be appreciated that other numbers of cells may be provided in each row or column. Each memory cell comprises a pair of cross coupled inverters 6 forming a latch which is bistable and can be placed in a first state in which a first inverter outputs a 0 and a second inverter outputs a 1 and a second state in which the first inverter outputs a 1 and the second inverter outputs a 0. The first and second states may be considered to represent logical '0' and logical '1' respectively, or vice versa.

Each column of cells has a pair of complementary bit lines 8 (bl, nbl) which are used to read and write to the memory cells in that column. Each cell 4 is connected to the bit lines 8 of the corresponding column via a pair of access transistors 10 whose gates are connected to a word line 12 corresponding to the row containing that cell. Each word line has an associated word line driver 14 for driving a word line signal on the word line 12. A set of sense amplifiers/bit line drivers 16 is connected to the bit lines 8 for sensing the state of the bit lines 8 during a read operation and outputting values to be written to the cell 4 on the bit lines 8 during a write operation.

To read the state of a selected memory cell 4, the word line 12 of the corresponding row of cells is asserted by the word line driver 14 for that row, turning on the control transistors 10 for all cells within the selected row. This couples the selected cell 6 to the corresponding bit lines 8 for the column containing the selected cell. The sense amplifier 16 detects the state of the bit lines 8 for the column including the selected cell, and depending on which of the bit lines is 0 and which of the bit lines is 1, a cell state of 0 or 1 can be determined. The sense amplifier 16 can read multiple cells in the same row in the same cycle by sensing the bit lines 8 for different columns.

To write to a selected memory cell 4, the word line of the corresponding row is again asserted, but this time bit line drivers 16 assert a '1' and '0' onto the bit lines 8 for a selected column, and depending on which of the bit lines is 0 and which is 1 this will cause the cell 4 at the intersection of the asserted word line 12 and the selected bit lines 8 to be set to a cell state of '0' or '1'. Again, it is possible to write to multiple cells 4 in the same row in the same cycle, by asserting multiple pairs of bit lines 8 for different columns with the values to be written to the corresponding cells 4.

It will be appreciated that other types of memory architecture could be used and that the memory integrated circuit 2 may have other features not illustrated in FIG. 1 for conciseness.

As well as the regular word lines 12, the memory integrated circuit 2 has a dummy word line 20 for controlling timings of operations within the memory. For example, to save power it may be desirable when reading memory cells to operate the sense amplifiers 16 in an active state for as little time as possible. A timing control signal 22 (ngtp) can be used to trigger the start of the read process to activate the sense amplifiers 16. However, it may not be apparent when the sense amplifiers 16 should stop sensing the bit lines 8, since this will depend on the number of cells in a row of the memory array, the number of rows, and the particular circuit configuration and load provided by each cell, for example. Therefore, the dummy word line 20 can be provided to replicate the real word lines 12. The dummy word line 20 has load resistances 24 connected to it, which simulate the load provided by the real cells 4 connected to a real word line 12. In some examples the loads 24 may actually comprise the same circuits as the real cells 4, while in other examples a different circuit arrangement to the cells 4 may be used to simulate the load of a cell. When the timing control signal 22 is input to the sense amplifiers 16 to start sensing the bit lines 8 for a read operation, then the timing control signal 22 may also be provided to the dummy word line 20, and a dummy word line signal may be propagated along the dummy word line 20 and down a dummy bit line 26 to the sense amplifiers 16. When the sense amplifiers 16 receive the signal along the dummy bit line 26 then it can be assumed that there has been sufficient time to read the values from the bit lines 8 and so the sense amplifiers 16 can now be deactivated. By using a dummy word line 20 in this way the operation of the sense amplifiers 16 can be scaled to different sized memory arrays. However, in some cases the timing control signal 22 may be generated in part of the circuit which operates in a different voltage domain to the rest of the memory array 2 shown in FIG. 1. Hence, a level shifter 30 may be provided to convert the timing control signal 22 into the dummy word line signal on the dummy word line 20.

Also, the word line drivers 14 may have associated header transistors 32 for selectively isolating the word line drivers from a power supply VDDCE. By gating the word line drivers in this way, power consumption can be reduced when the word line drivers 14 are not required. However, the control signals 34 for controlling the header transistors 32 may be generated in a different voltage domain to the VDDCE domain used by the memory circuit 2, and so a level shifter 40 can be provided for converting the control signals 34 into the signals applied to the gates of the header transistors 32.

In general, the level shifters 30, 40 described below convert an input signal which is at one of a higher input level VDDPE and a lower input level 0 into an output signal having one of a higher output level VDDCE and a lower output level 0. However, it will be appreciated that in some embodiments the lower output level could be different to the lower input level.

Figure 2:
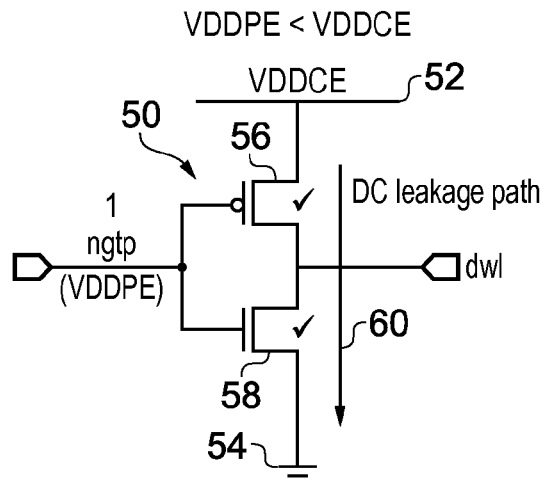
FIGS. 2 and 3 show known level conversion circuits.

FIG. 2 shows a first example of a known level conversion circuit which simply comprises a single inverter 50 coupled between a supply rail 52 for supplying the higher output level VDDCE and a supply rail 54 for providing the lower output level (ground). The input of the inverter 50 receives the input signal (ngtp) and the output of the inverter outputs the output signal (dwl). However, with this approach there is a problem when the higher input level VDDPE is less than the higher output level VDDCE, because when the input signal is high (VDDPE) then it may still be lower than the threshold voltage of the p-type pull up transistor 56 of the inverter 50, and so both the pullup transistor 56 and a pulldown transistor 58 of the inverter 50 may be on at the same time. When both of these transistors are on, there is a DC leakage path 60 between the high and low output voltage rails 52, 54, which is undesirable because it wastes power and could lead to damage to the circuit.

Figure 3:
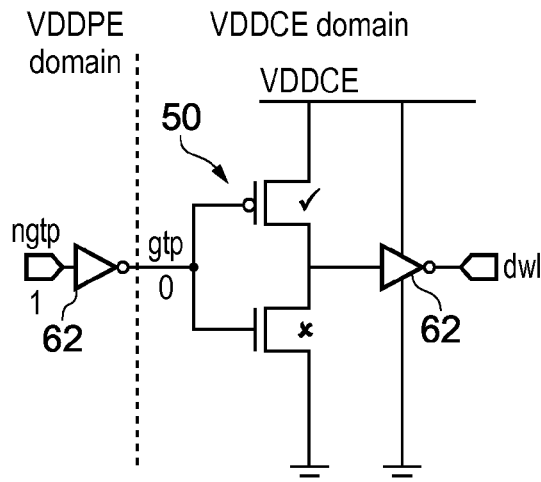

FIG. 3 shows a second example of a known level conversion circuit which addresses the leakage problem in FIG. 2 by providing an additional two inverters 62 either side of the inverter 50. The inverter 50 is the same as in FIG. 2. The first of the additional inverters 62 is in the input (VDDPE) domain and inverts the input signal ngtp to provide an inverted signal gtp to the inverter 50. The second of the inverters 62 is in the output (VDDCE) domain at the output of the inverter 50 and simply inverts the output of the inverter 50 back again so that the relationship between the input signal ngtp and the output signal dwl is the same as in FIG. 2. While the additional inverters 62 do not completely remove the DC leakage path which may occur in the inverter 50 when the inverted signal gtp is 1, the timing control signal 22 is in an active state when ngtp is 0 and an inactive state when ngtp is 1, and the inactive state occurs more often than the active state. Therefore, by inverting ngtp and supplying gtp to the inverter 50, the DC leakage will only occur for a short time while the input signal ngtp is in the active state, and not in the inactive state. Hence, the example of FIG. 3 reduces the amount of time for which the leakage path occurs. However, the addition of the extra inverters 62 means there is now a three inverter stage delay between the input signal and the output signal in comparison to a one inverter stage delay in FIG. 2. This additional delay slows down the response of the memory circuit 2 to the timing control signal ngtp, and so is not suitable for providing a high performance memory device.

Figure 4:
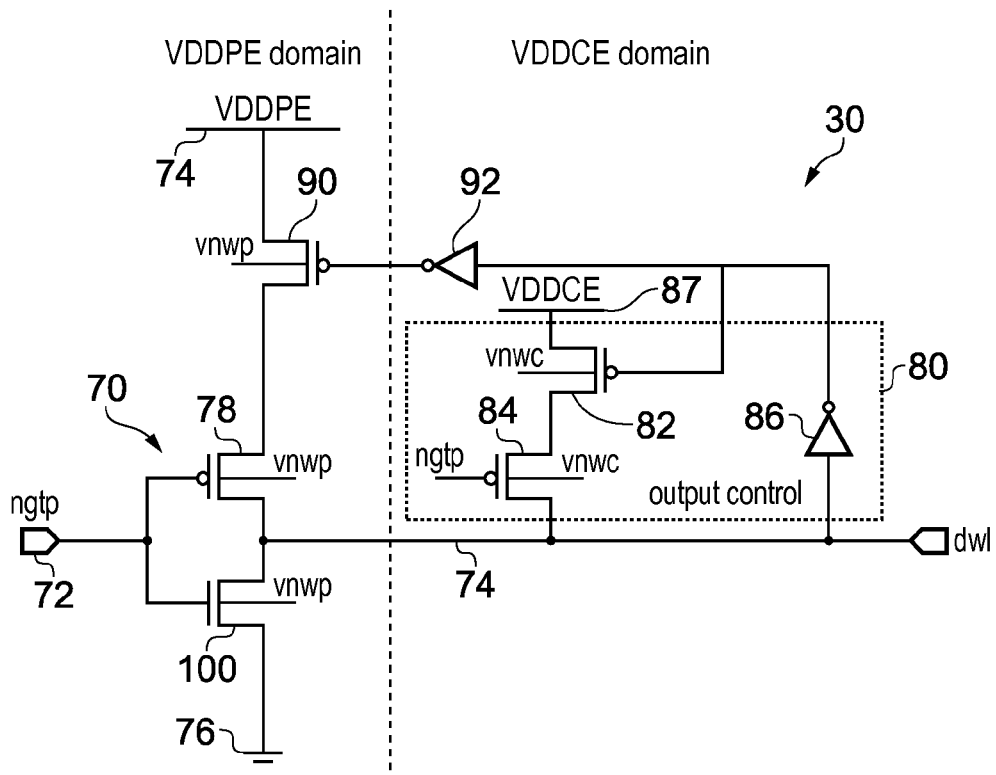
FIG. 4 schematically illustrates a first example of a level conversion circuit according to the present technique.

FIG. 4 shows a first example of a level conversion circuit 30 according to the present technique for addressing these problems. The level conversion circuit 30 comprises input circuitry 70 (in the form of an inverter in this example) which has an input receiving the input signal (timing control signal ngtp) 72 and an output connected to the output line 74 for outputting the output signal (dummy wordline signal dwl). The inverter 70 is in the input power domain (VDDPE domain) so that it is connected between a supply rail 74 for supplying the higher input level (VDDPE) and a supply rail 76 for providing the lower input level (ground voltage). This means that the leakage path shown in FIG. 2 cannot arise because when the input signal 72 is high, it is at the same level as the higher voltage level VDDPE supplied to the inverter 70, and so the pullup transistor 78 of the inverter 70 is non-conductive.

The level conversion circuit 30 also has output control circuitry 80 which is coupled to the output line 74 and is in the output voltage domain (VDDCE domain). The output control circuitry 80 is for pulling the output line 74 to the higher output level VDDCE after the input inverter 70 starts pulling the output line 74 to the higher input level VDDPE. The output control circuitry 80 has a p-type output control transistor 82 and a p-type cut-off transistor 84 which are arranged in series between the output line 74 and a supply rail 87 for supplying the VDDCE level. The gate terminal of the output control transistor 82 is connected to an inverted signal obtained by an inverter 86 inverting the signal on the output line 74. The gate of the cut-off transistor 84 is connected to the input signal 72 (ngtp).

The level conversion circuit 30 also has an isolating transistor 90 which is coupled between the VDDPE supply rail 74 and the input inverter 70. Another inverter 92 is provided which inverts the output of the inverter 86 of the output control circuitry 80 and supplies the inverted signal to the gate of the isolating transistor 90. The isolating transistor 90 is for cutting off the supply to the input inverter 70 once it has switched the output signal 74 to the VDDPE level so that it does not complete with the output control circuitry 80 which is pulling the output signal to the VDDCE level. The transistors in the VDDPE domain are biased to a bias voltage vnwp and the transistors 82, 84 in the VDDCE domain are biased to a bias voltage vnwc.

Figure 5:
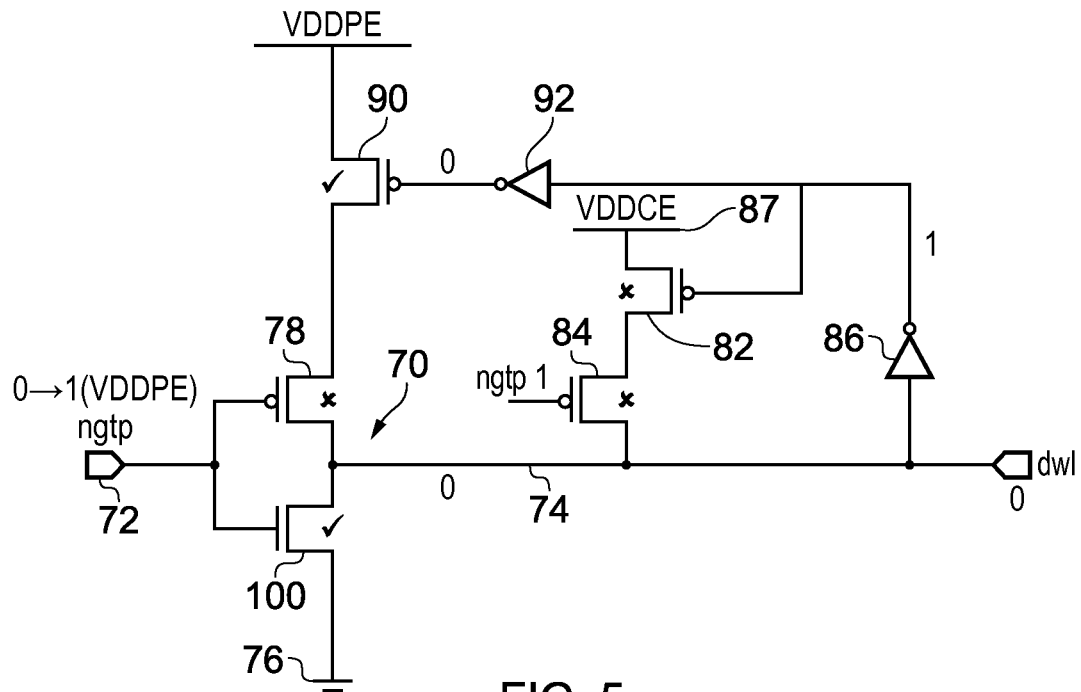
FIGS. 5 and 6 illustrate the operation of the level conversion circuit of FIG. 4.
Figure 6:
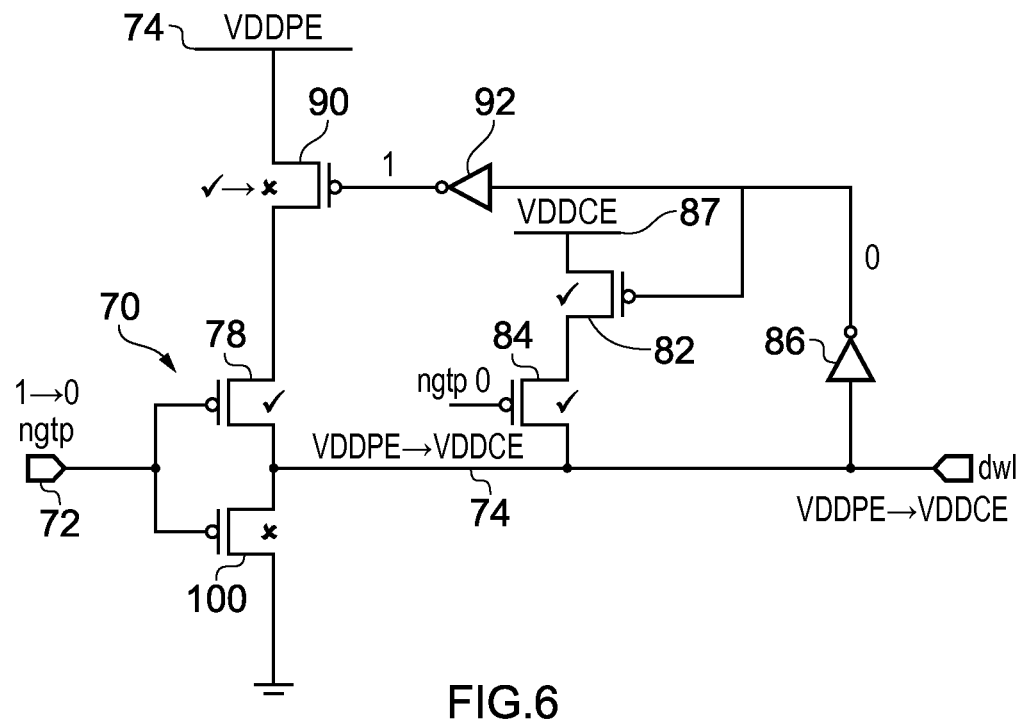

FIGS. 5 and 6 show an example of the operation of the level conversion circuit 30 of FIG. 4. FIG. 5 shows the case where the input signal 72 switches from the lower input level (0) to the higher input level (1 or VDDPE). This turns off the pullup transistor of the inverter 70 and turns on pulldown transistor 100. There is no leakage path since pullup transistor 78 is off. The pulldown transistor 100 pulls the output line 74 to the ground level (lower input level), which is the same as the lower output in this case and so the output signal dwl is 0. The inverter 86 inverts the output signal level to generate a signal at the VDDCE level (1), which is applied to the gate of output control transistor 82, switching off the output control transistor 82. The inverter 92 inverts the signal from inverter 86 again, to generate a signal at the ground level (0) which turns on the isolating transistor 90.

As shown in FIG. 6, when the input signal ngtp switches low then this turns on pullup transistor 78 and turns off pulldown transistor 100. As the isolating transistor 90 is currently on then the output line 74 is pulled to the higher input level VDDPE. This means that the inverter 86 switches its output low, turning on the output control transistor 82. Since the input signal has gone low and the cut off transistor 84 is a p-type transistor then the cut-off transistor is on, and so there is a conduction path between the VDDCE rail 87 and the output line 74, to pull the output signal to the higher output level VDDCE. Hence, the VDDPE level provided on the output line 74 by the input circuitry 70 is a transient (temporary) output signal and the output control circuitry 80 then pulls the output signal 74 to the required higher output level VDDCE. The inverter 92 switches its output high (1) in response to the signal provided by inverter 86, and this switches off the isolating transistor 90, to isolate the inverter 70 from the higher input level 74 (VDDPE). This means that the input inverter 70 will stop competing with the output control circuitry 80, so that the output control transistor 82 and cut-off transistor 84 can pull the output signal to the VDDCE level more quickly.

When the input signal ngtp later switches high again, then as shown in FIG. 5 this will turn off the cut-off transistor 84 so that the output control circuitry 80 does not compete with the pulldown transistor 100 of the input inverter 70, allowing the output signal on the output line 74 to transition low more quickly.

Hence, this circuit allows a faster response of the output signal to changes in the input signal while avoiding the leakage problem shown in FIG. 2. Since the input inverter 70 is in the input domain VDDPE then the leakage problem does not arise. Nevertheless, since the input inverter 70 is connected directly to the output line and the output control circuitry 80 kicks in after the input inverter 70 starts pulling the output line high, this allows a smaller delay than in FIG. 3.

While FIG. 4 shows an example where the input circuitry 70 is an inverter, in other cases the input circuitry could be another circuit such a buffer which provides a non-inverting relationship between the input signal 72 and the output signal 74. Also, in some cases the cut off transistor 84 could be omitted and instead the pulldown transistor 100 of the input inverter 70 may be sized so that it is strong enough to overcome the pull of output control transistor 82 without the need for a cut-off transistor 84. Similarly, the isolating transistor 90 may be omitted if the output control transistor 82 is sized so that it is strong enough to overcome the pull of the pullup transistor 78 of the input inverter 70. However, the provision of the cut-off transistor 84 and isolating transistor 90 makes the circuit design easier and more power efficient by eliminating constraints on transistor sizing and allowing smaller transistors to be used for the transistors 78, 100, 82.

The example shown in FIGS. 4 to 6 is useful for the level shifter 30 for controlling the dummy word line in the memory shown in FIG. 1. However, this embodiment could also be used for other applications, including in integrated circuits other than memory circuits.

Figure 7:
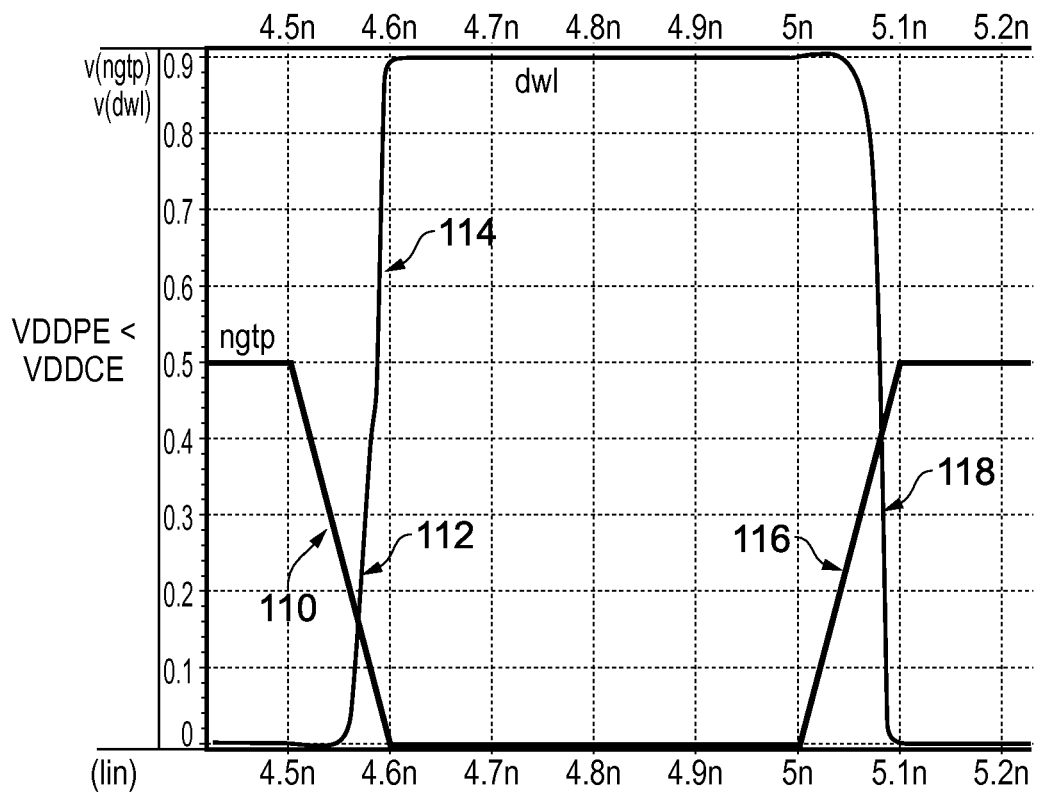
FIGS. 7 to 10 show simulation results illustrating the level conversion circuit generating an output signal in response to an input signal.

FIGS. 7 to 10 show simulation results illustrating the generation of an output signal dwl in response to an input signal ngtp using the level shifter of FIG. 4. FIG. 7 shows an example where the higher input level VDDPE is smaller than the higher output level VDDCE. In response to a falling transition 110 of the input signal, the input inverter 70 starts to pull the output signal to the VDDPE level at part 112 of the graph in FIG. 7, but then the output circuitry 80 detects the rising transition of the output signal to VDDPE and pulls the output signal up to VDDCE at part 114. In response to a rising edge transition 116 of the input signal, the pull down transistor 100 of the input inverter 70 pulls the output signal to ground at part 118.

Figure 8:
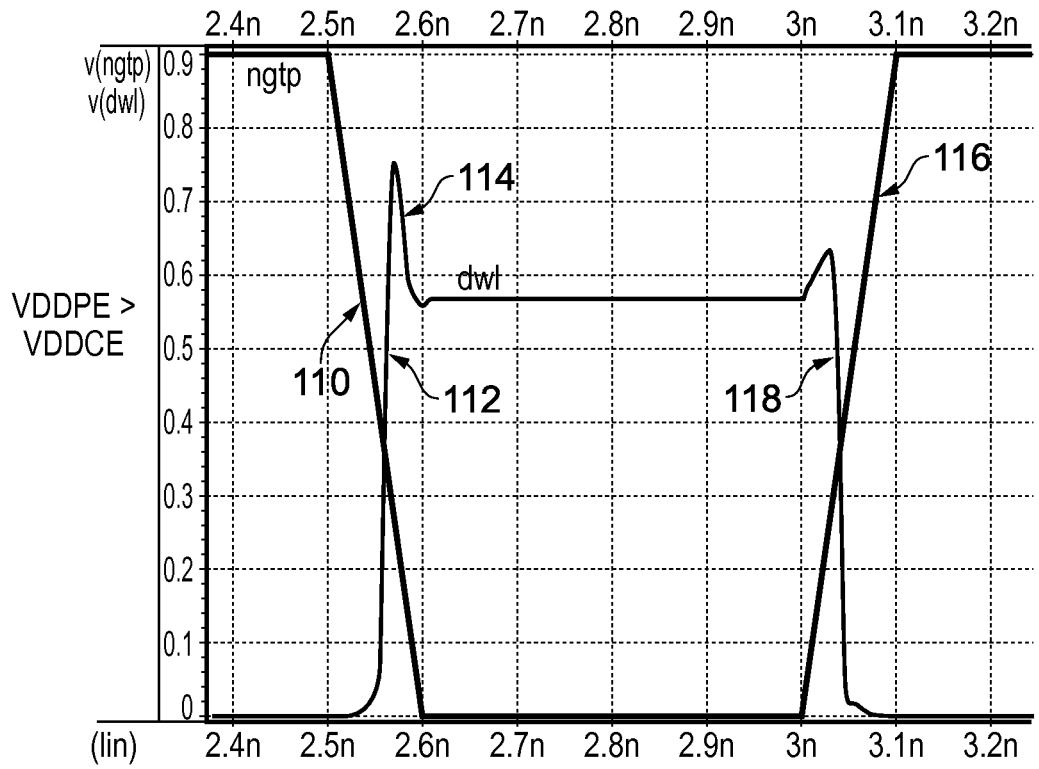

On the other hand, FIG. 8 shows an example where the higher input level VDDPE is greater than the higher output level VDDCE. Again, in response to a falling edge transition 110, the input inverter 70 starts to pull the output signal to VDDPE at part 112, but then the output control circuitry kicks in at part 114 to pull the output signal back down to VDDCE. In response to a rising edge transition 116 of the input signal the transistor 100 pulls the output signal low at part 118.

In the simulations of FIGS. 7 and 8, the leakage current was as follows, when compared with the known circuit of FIG. 2:

| Leakage Table (GTP = 0) | FIG. 4 | FIG. 2 |
| --- | --- | --- |
| FF; 100 C.; VDDP = 0.5 V; VDDC = 0.9 V | 186 nA | 338 uA (DC path) |
| FF; 100 C.; VDDP = 0.9 V; VDDC = 0.5 V | 260 nA | 171 nA |

Hence, when converting from a lower voltage domain to a higher voltage domain, the DC leakage path of FIG. 2 is eliminated and the amount of leakage current is much less (reduced by a factor of 1000) in the example of FIG. 4 compared to FIG. 2, without greatly affecting the amount of leakage when the input voltage domain is higher than the output voltage domain. As shown in FIGS. 7 and 8, the level conversion circuit of FIG. 4 is capable of converting both from a lower domain to a higher domain and vice versa.

Figure 9:
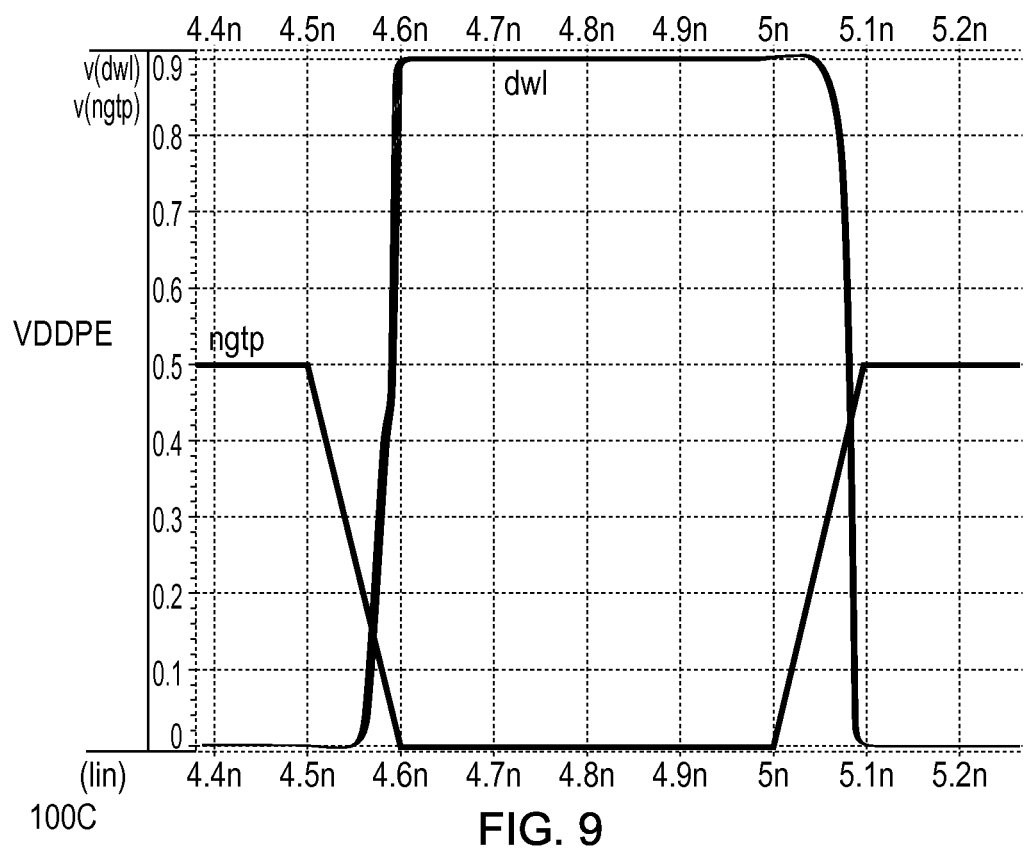
Figure 10:
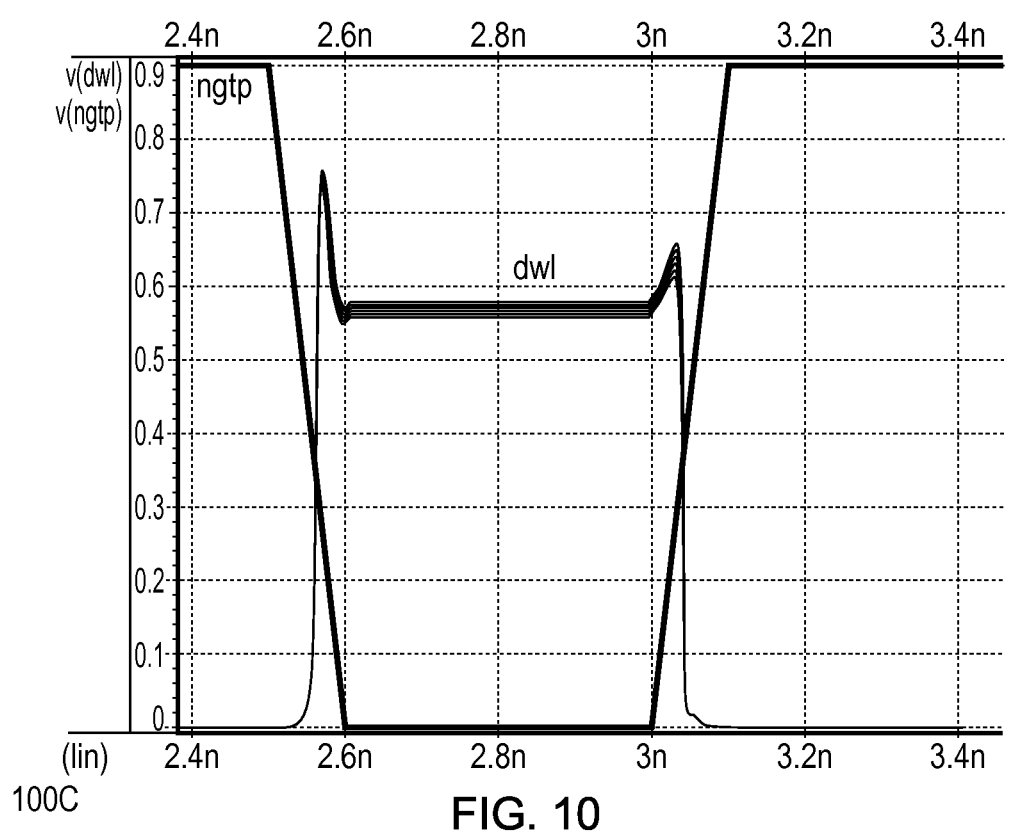

FIGS. 9 and 10 show Monte Carlo simulation results performed over 5000 iterations in the case where the level conversion circuit is operated at 100° C. These show similar trends to FIGS. 7 and 8 respectively.

Figure 11:
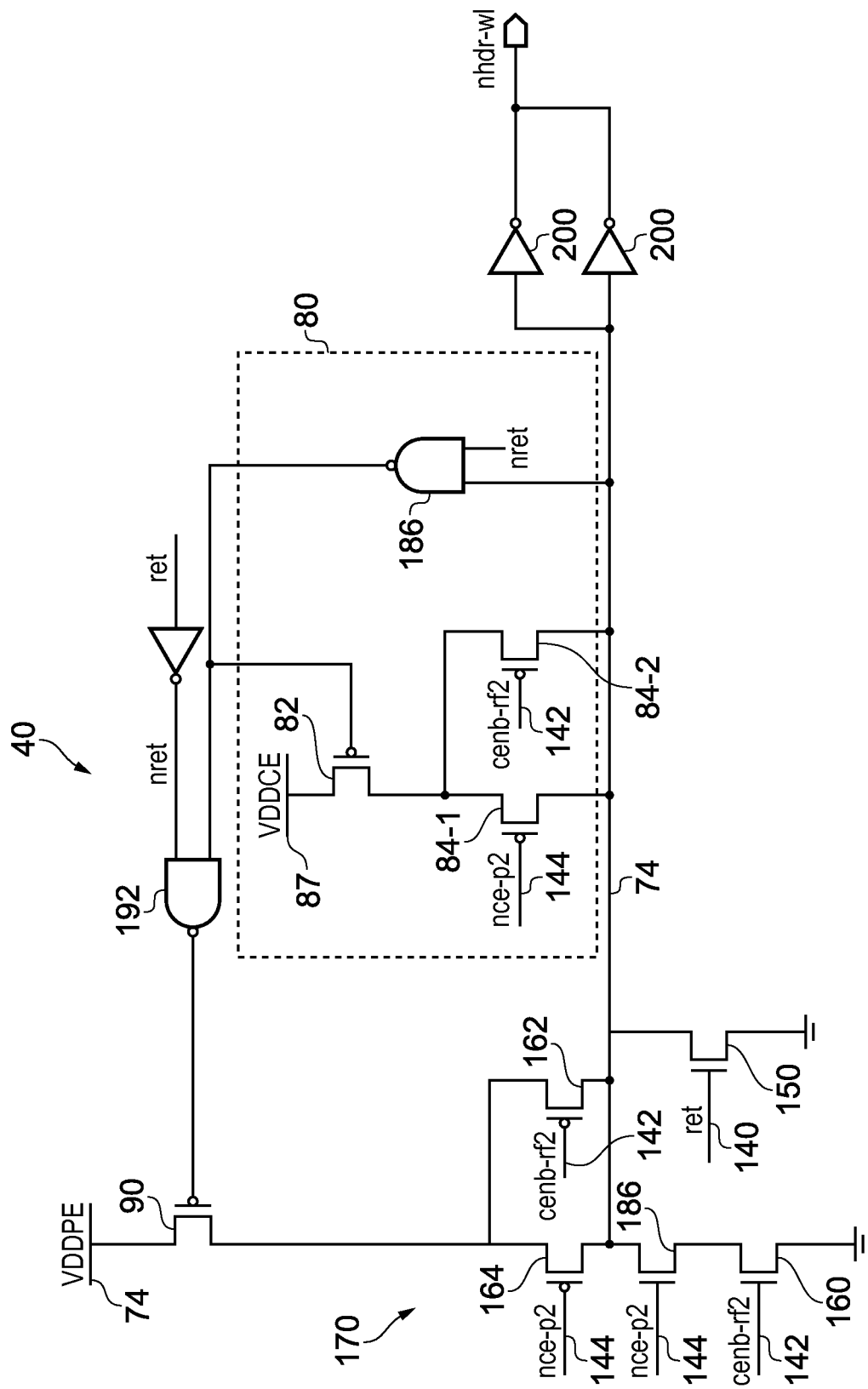
FIG. 11 shows a second example of a level conversion circuit.

FIG. 11 shows a second example of the level shifter 40 which can be used for generating the control signal for the header transistors 32 as shown in FIG. 1. The elements of FIG. 11 that are the same as in FIG. 4 are illustrated with the same numerals. As in FIG. 4, there is an input inverter 170, but in FIG. 11 the input inverter 170 receives multiple input signals rather than just one input signal as in FIG. 4. The input signals include a retention signal 140, and two control signals 142, 144. The retention signal is for placing the level conversion circuit in a power saving mode. When the retention signal (ret) 140 is high, a transistor 150 pulls the output line 74 low. The inverters 86, 92 of FIG. 4 are replaced with NAND gates 186, 192 which receive an inverted version (nret) of the retention signal 140. When the retention signal is high to place the circuit in the power saving (retention) mode, nret is low, clamping the output of the NAND gates 186, 192 at 1 so that the output control transistor 82 and the isolating transistor 90 stay off to reduce dynamic switching leakage.

On the other hand, when retention signal 140 is low, then the level conversion circuit 40 switches the output signal on the output line 74 depending on the state of the two control signals 142, 144. The two control signals 142, 144 could be any control signals, but in one example they may be control signals for activating different read/write ports of the memory. When one port is activated then one control signal 142, 144 may be asserted and the other control signal deasserted, while if both ports are active then both control signals 142, 144 may be asserted. In the example of FIG. 11 the first control signal 142 takes precedence so that if control signal 142 is low, then a pulldown transistor 160 is switched off and a pullup transistor 162 is switched on to pull the output signal 74 to VDDPE. In this state, the second control signal 144 does not affect the level of the output signal 74. On the other hand, when the first control signal 142 is high then the pulldown transistor 160 turns on and the pullup transistor 162 turns off, and then the output signal 74 is pulled to either the VDDPE level if the second control signal 144 is low or the ground level if the second control signal 144 is high, as controlled by pullup and pulldown transistors 164, 166 respectively. Hence, the input inverter 170 in FIG. 11 outputs either VDDPE or ground as in FIG. 4, but in response to a greater number of control signals.

Two cut off transistors 84-1, 84-2 are provided in the output control circuitry 80, each controlled by one of the control signals 142, 144. The cut-off transistors isolate the output line 74 from the output control transistor 82 when both control signals 142, 144 are high indicating that the pull down portion 160, 166 of the inverter 170 is active, to speed up pulling the output line 74 low. Otherwise, the output control circuitry functions in the same way as FIGS. 4-6 to detect the rising transition of the temporary output signal on output line 74 and to pull the output signal to the VDDCE level of the VDDCE rail 86 via the output control transistor 82. The isolating transistor 90 functions in the same way as in FIGS. 4-6 to isolate the input inverter 170 from VDDPE rail 74.

FIG. 11 also differs from FIG. 4 in that a pair of inverters 200 is provided to invert the signal on the output line 74 to produce the header control signal for the header transistor 32 in FIG. 1. The inverters are provided because the header control signal for headers 32 corresponds to the non-inverted value of the control signals 142, 144 in this embodiment, not the inverted value as placed on the output line 74. However, in other embodiments it is possible to remove the inverters 200 and instead use an output signal which is inverted relative to the input signal(s). Also, the two inverters 200 could be replaced with one inverter having wider transistors if desired.

The level conversion circuits discussed above can be manufactured at different process nodes, such as for example 16 nm or 10 nm process nodes. The transistors used in the level conversion circuits can be of various types, for example field effect transistors (FET), bipolar junction transistors (BJT), complementary metal oxide semiconductor transistors (CMOS), FinFETs or NanoFETs.

Figure 12:
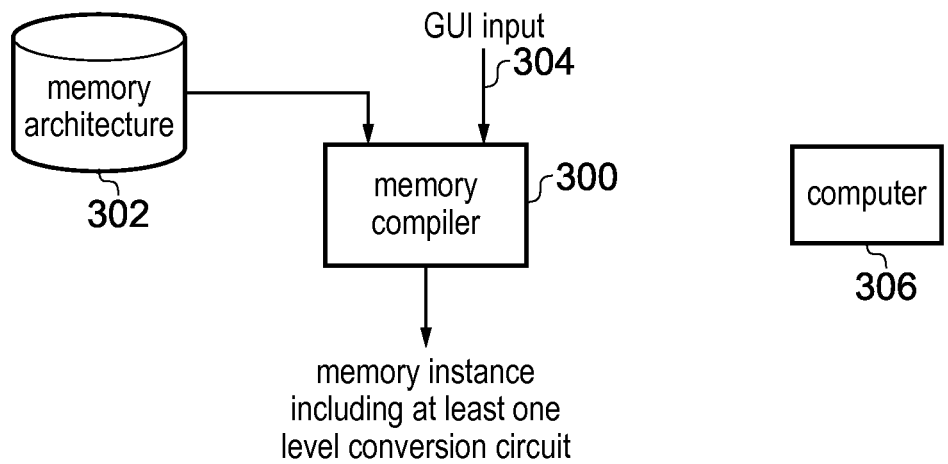
FIG. 12 illustrates an example of a memory compiler for compiling a memory instance including the level conversion circuit.

FIG. 12 shows an example of a memory compiler 300 for compiling memory instances according to a specified memory architecture 302 which is stored on a recordable medium. A GUI input 304 provided by the user is provided to the memory complier 300 to specify properties of the memory instance to be generated, such as the number of rows and columns in the memory array, multiplexing arrangements of the memory array, and selection of various optional features such as power gating, built in self test (BIST) modes to be supported, etc. The memory compiler 300 is provided as a software programme executing on a general purpose computer 306. Memory compilers 300 known in the prior art may be extended so that they can include in the memory instance at least one level conversion circuit as shown in the embodiments above.

Figure 13:
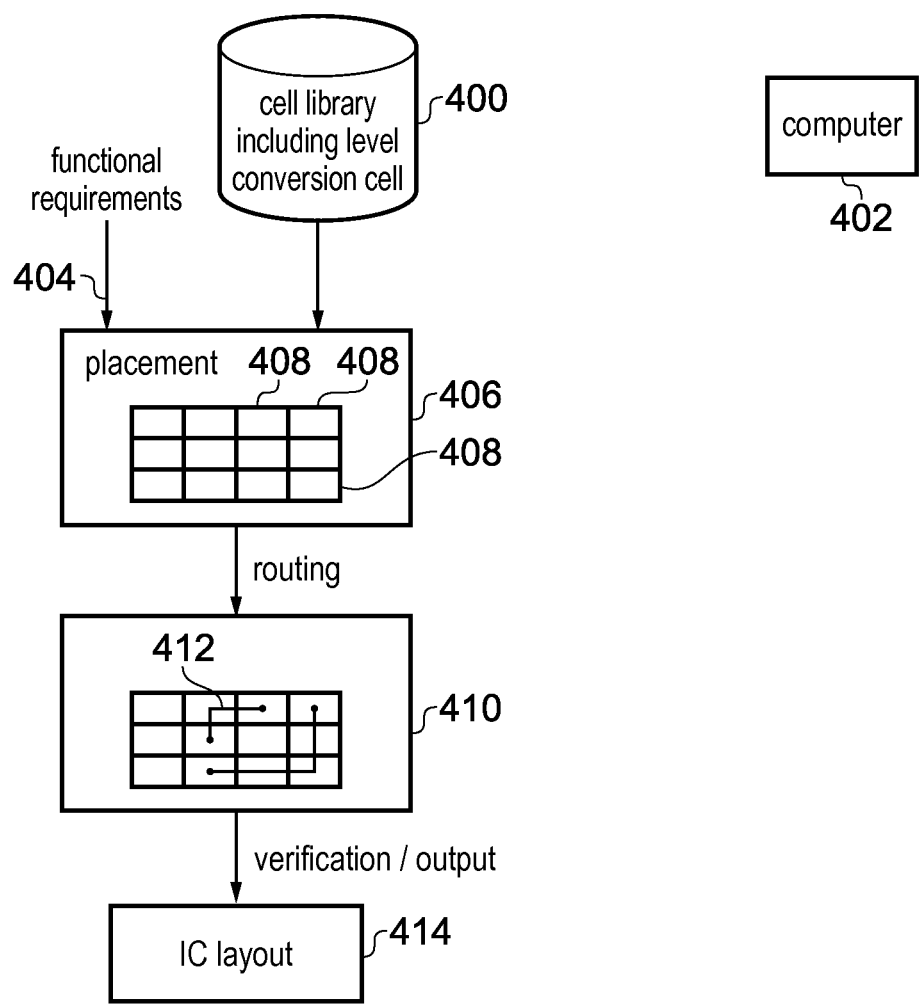
FIG. 13 shows an example of an automated integrated circuit design process using a standard cell library which includes a standard cell corresponding to the level conversion circuit.

FIG. 13 shows an example of a standard cell library 400 which is provided on a recording medium and stores data defining standard cells which can be used to produce an integrated circuit layout using an automated design process. The generated integrated circuit may be for any purpose (not limited to a memory). An automated design program runs on a general purpose computer 402. The user specifies functional requirements 404 of the integrated circuit to be designed. The design program performs a placement step to generate a cell placement 406 in which various standard cells 408 from the standard cell library 400 are placed in a circuit layout. A routing step is performed to produce a routed design 410 in which various interconnections 412 between different cells in the placement 406 are added. A verification/output step is performed to check that the generated design actually meets the functional requirements 404 that were specified by the user, and then an integrated circuit layout 414 can be output. The level conversion circuits discussed above may be included in the cell library 400 as a standard cell, so that they may be included in the integrated circuit layout.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:

1. A level conversion circuit for generating an output signal on an output line in response to one or more input signals having one of a higher input level and a lower input level, and the output signal having one of a higher output level and a lower output level, the level conversion circuit comprising:
    input circuitry coupled to a first supply node for supplying the higher input level and having a first input for receiving a first input signal, a second input for receiving a second input signal, and an output coupled to the output line, wherein:
        the input circuitry is configured to output a temporary output signal on the output line having one of the higher input level and the lower input level,
        the input circuitry is configured to output a rising transition of the temporary output signal towards the higher input level in response to a first transition of the first input signal between the higher input level and the lower input level, and
        following a second transition of the first input signal in an opposite direction to the first transition, the input circuitry is configured to output the rising transition of the temporary output signal in response to a predetermined transition of the second input signal between the higher input level and the lower input level; and
    output control circuitry coupled to the output line and a second supply node for supplying the higher output level, and configured to detect the rising transition of the temporary output signal on the output line and, in response to detecting the rising transition of the temporary output signal, to pull the output signal on the output line to the higher output level.

2. The level conversion circuit according to claim 1, wherein the input circuitry comprises inverting circuitry, and wherein the first transition of the first input signal comprises a falling transition from the higher input level towards the lower input level.

3. The level conversion circuit according to claim 1, wherein in response to the second transition of the first input signal between the higher input level and the lower input level in the opposite direction to the first transition, the input circuitry is configured to output a falling transition of the temporary output signal towards the lower input level.

4. The level conversion circuit according to claim 1, wherein the lower input level is the same as the lower output level.

5. The level conversion circuit according to claim 1, comprising isolating circuitry configured to isolate the input circuitry from the first supply node in response to the rising transition of the temporary output signal on the output line.

6. The level conversion circuit according to claim 5, wherein, in response to the rising transition of the temporary output signal on the output line, the output control circuitry is configured to start pulling the output signal on the output line to the higher output level before the isolating circuitry isolates the input circuitry from the first supply node.

7. The level conversion circuit according to claim 1, wherein the output control circuitry comprises an output control transistor coupled between the output line and the second supply node;
    wherein the output control transistor is configured to operate in a conductive state in response to the rising transition of the temporary output signal on the output line, and to operate in a less conductive state in response to a transition of the output signal on the output line towards the low output level or the low input level.

8. The level conversion circuit according to claim 7, wherein the output control transistor comprises a p-type transistor;
    the output control circuitry comprises output inverting circuitry configured to invert the signal on the output line; and
    a gate terminal of the output control transistor is coupled to an output of the output inverting circuitry.

9. A level conversion circuit for generating an output signal on an output line in response to an input signal, the input signal having one of a higher input level and a lower input level, and the output signal having one of a higher output level and a lower output level, the level conversion circuit comprising:
    input circuitry coupled to a first supply node for supplying the higher input level and having an input for receiving the input signal and an output coupled to the output line, wherein the input circuitry is configured to output a temporary output signal on the output line having one of the higher input level and the lower input level, and the input circuitry is configured to output a rising transition of the temporary output signal towards the higher input level in response to a first transition of the input signal between the higher input level and the lower input level; and
    output control circuitry coupled to the output line and a second supply node for supplying the higher output level, and configured to detect the rising transition of the temporary output signal on the output line and, in response to detecting the rising transition of the temporary output signal, to pull the output signal on the output line to the higher output level,
    wherein the output control circuitry comprises an output control transistor coupled between the output line and the second supply node,
    wherein the output control transistor is configured to operate in a conductive state in response to the rising transition of the temporary output signal on the output line, and to operate in a less conductive state in response to a transition of the output signal on the output line towards the low output level or the low input level,
    wherein the output control circuitry further comprises a cut-off transistor coupled in series with the output control transistor between the output line and the second supply node, and
    wherein the cut-off transistor is configured to operate in a conductive state in response to the first transition of the input signal, and to operate in a less conductive state in response to a second transition of the input signal in the opposite direction to the first transition.

10. The level conversion circuit according to claim 1, wherein the level conversion circuit supports the higher output level being higher than the higher input level, and also supports the higher output level being lower than the higher input level.

11. An integrated circuit comprising the level conversion circuit according to claim 1.

12. The integrated circuit according to claim 11, wherein the integrated circuit comprises a memory integrated circuit comprising a plurality of memory cells for storing data.

13. The integrated circuit according to claim 12, wherein the memory integrated circuit comprises a dummy word line and control circuitry configured to control timing of operations within the memory integrated circuit based on a dummy word line signal asserted on the dummy word line in response to a timing control signal; and
the first input signal of the level conversion circuit comprises the timing control signal, and the output signal of the level conversion circuit comprises the dummy word line signal.

14. The integrated circuit according to claim 12, wherein the memory integrated circuit comprises a word line, a word line driver configured to assert a word line signal on the word line, and a power gating circuit configured to selectively couple the word line driver to a power supply node in response to a gating control signal; and
the first input signal of the level conversion circuit comprises the gating control signal, and the output signal of the level conversion circuit is supplied to the power gating circuit.

15. A computer-readable storage medium storing a memory compiler computer program for controlling a computer to generate an instance of a memory device from a memory architecture associated with the memory compiler computer program, the memory architecture specifying a definition of circuit elements and data defining rules for combining those circuit elements, such that the instance generated specifies a memory device comprising a level conversion circuit for generating an output signal on an output line in response to an input signal, the input signal having one of a higher input level and a lower input level, and the output signal having one of a higher output level and a lower output level, the level conversion circuit comprising:
input circuitry coupled to a first supply node for supplying the higher input level and having an input for receiving the input signal and an output coupled to the output line, wherein the input circuitry is configured to output a temporary output signal on the output line having one of the higher input level and the lower input level, and the input circuitry is configured to output a rising transition of the temporary output signal towards the higher input level in response to a first transition of the input signal between the higher input level and the lower input level; and
output control circuitry coupled to the output line and a second supply node for supplying the higher output level, and configured to detect the rising transition of the temporary output signal on the output line and, in response to detecting the rising transition of the temporary output signal, to pull the output signal on the output line to the higher output level.

16. A computer-readable storage medium storing a standard cell library comprising information defining a plurality of standard cells for inclusion in an integrated circuit layout, the plurality of standard cells comprising a level conversion standard cell corresponding to a level conversion circuit for generating an output signal on an output line in response to an input signal, the input signal having one of a higher input level and a lower input level, and the output signal having one of a higher output level and a lower output level, the level conversion circuit comprising:
input circuitry coupled to a first supply node for supplying the higher input level and having an input for receiving the input signal and an output coupled to the output line, wherein the input circuitry is configured to output a temporary output signal on the output line having one of the higher input level and the lower input level, and the input circuitry is configured to output a rising transition of the temporary output signal towards the higher input level in response to a first transition of the input signal between the higher input level and the lower input level; and
output control circuitry coupled to the output line and a second supply node for supplying the higher output level, and configured to detect the rising transition of the temporary output signal on the output line and, in response to detecting the rising transition of the temporary output signal, to pull the output signal on the output line to the higher output level.

17. A level conversion circuit for generating an output signal on an output line in response to an input signal, the input signal having one of a higher input level and a lower input level, and the output signal having one of a higher output level and a lower output level, the level conversion circuit comprising:
input means for receiving the input signal, the input means being coupled to a first supply node for supplying the higher input level and having an output coupled to the output line, wherein the input means is configured to output a temporary output signal on the output line having one of the higher input level and the lower input level, and the input means is configured to output a rising transition of the temporary output signal towards the higher input level in response to a first transition of the input signal between the higher input level and the lower input level, and wherein the input means has inverting circuitry that is configured to trigger the rising transition of the temporary output signal when the first transition of the input signal is a falling transition from the higher input level to the lower input level; and
output control means for detecting the rising transition of the temporary output signal on the output line and, in response to detecting the rising transition of the temporary output signal, pulling the output signal on the output line to the higher output level, the output control means being coupled to the output line and a second supply node for supplying the higher output level.

18. A level conversion method for generating an output signal on an output line in response to an input signal, the input signal having one of a higher input level and a lower input level, and the output signal having one of a higher output level and a lower output level, the level conversion circuit comprising:
receiving the input signal;
in response to a first transition of the input signal between the higher input level and the lower input level, outputting on the output line a rising transition of a temporary output signal towards the higher input level;
isolating the higher input level of the input signal in response to the rising transition of the temporary output signal on the output line;

detecting the rising transition of the temporary output signal; and in response to detecting the rising transition of the temporary output signal on the output line, pulling the output signal on the output line to the higher output level.

* * * * *